United States Patent [19]

Bollong et al.

[11] Patent Number: 4,888,051
[45] Date of Patent: Dec. 19, 1989

[54] METHOD FOR THE ZONE REFINING OF GALLIUM

[75] Inventors: Alan B. I. Bollong; Roelof P. Bult, both of Fruitvale; Gary T. Proux, Trail, all of Canada

[73] Assignee: Cominco Ltd., Vancouver, Canada

[21] Appl. No.: 233,710

[22] Filed: Aug. 19, 1988

[51] Int. Cl.[4] ............................................. C22B 58/00
[52] U.S. Cl. ........................................ 75/10.11; 75/63; 75/65 ZM; 75/84; 75/10.13
[58] Field of Search .................. 75/10.11, 65 ZM, 63, 75/10.13, 84

[56] References Cited

FOREIGN PATENT DOCUMENTS 736165 9/1955 United Kingdom ............ 75/65 ZM

Primary Examiner—Melvyn J. Andrews
Attorney, Agent, or Firm—Cushman, Darby & Cushman

[57] ABSTRACT

Gallium is zone refined in a stationary, vertical, double annulus refiner. Impure gallium is contained between walls of a first annulus that are made of a material that does not impart impurities to the gallium. At least one of the walls is made of a flexible material. A cooling fluid is circulated through a second annulus enveloping the first annulus. The gallium is zone refined by moving through the gallium ingot one or more molten zones formed by radio frequency waves from at least one reciprocating radio frequency heating induction coil. After the necessary number of passes, the ingot is cropped without introducing contaminants and refined gallium with purities between 79 and 89 is recovered. LEC single crystal GaAs made with the so refined gallium has very uniform electrical characteristics.

19 Claims, 2 Drawing Sheets

METHOD FOR THE ZONE REFINING OF GALLIUM

This invention relates to a method for the zone refining of gallium.

The United States Government has rights in this invention pursuant Contract No. F33615-86-C-5019 awarded by the Department of the Air Force.

BACKGROUND AND PRIOR ART

The zone refining of gallium has been practised in the past, but it is noted in many references that the process is difficult to execute because of the low melting temperature of gallium, its high degree of expansion upon solidifying and its relatively high thermal conductivity.

Pfann, in U.S. Pat. No. 2,739 088, mentions the zone refining of gallium in a closed ring that rotates in a horizontal or inclined plane. Detwiler and Fox (Trans. AIME 203, p. 205, January 1955 J. of Metals) zone refined a gallium ingot in a closed Pyrex tube sliding inside heating and cooling coils, using the reciprocating method. Richards (Nature 177, (4500), p. 182, Jan. 28, 1956) stated that zone refining of gallium was not effective, and he purified gallium indirectly by zone refining gallium chloride and reducing the purified chloride to metal. Liu Min-Chih (Acta Phys. Sinica 15, (7), 389, 1959) produced 69 gallium by zone refining in a horizontal rotating spiral coil made of a plastic material. The coil is cooled at its lower portion and heated at its top portion creating moving solid and liquid zones. Gallium has also been zone refined by moving an ingot of gallium over a plate having alternating cooling and heating zones, or by moving spaced heaters over the ingot which is cooled from below (Acta Chim. Acad. Sci. Hung., 24, 466–472, 1960). Zone refining of gallium has been enhanced by electromagnetic stirring (Chem. Abs., volume 70, 6194h), the use of seed crystals (Trans. Met. Soc. AIME 221, 889, Aug. 1961), vacuum melting (Chem. Abs., volume 80, 98667x), and a heat exchanger that supercools the melt during solidification (Chem. Abs., volume 90, 125185d).

The various methods illustrated in the prior art for the zone refining of gallium have a number of serious drawbacks that reinforce the statements in the literature that gallium is difficult to purify by zone refining. A complex apparatus is generally necessary that in most cases comprises a helix or an annulus of material that is rotated or wherein a heater is rotated. The use of complex apparatus only allows small amounts of gallium to be purified and large scale production would require a plurality of such apparatus thereby increasing costs considerably. The containment of the gallium becomes a problem when large amounts of high-purity gallium are to be produced. The expansion of gallium when it solidifies rules out the use of Pyrex or quartz for its containment, while materials that have a degree of flexibility that can accommodate expansion, such as polyvinyl chloride and polyethylene, are usually a source of impurities that contaminate the gallium. Another problem in the refining of gallium is its affinity for oxygen. Although vacuum melting and other means have been used to exclude oxygen, the small and complex apparatus of the prior art make it difficult to exclude oxygen. It would, therefore, be advantageous to produce large quantities of high-purity gallium by zone refining with apparatus of simple construction that can accommodate expansions and can be operated such that exposure to oxygen is minimal.

SUMMARY OF THE INVENTION

We have now found that gallium can be zone refined to a high purity and in large quantities by enclosing impure gallium in an annulus of a stationary, double annulus, vertical refiner having a wall between the two annuli made of a flexible material that does not impart impurities to the gallium. The use of a flexible material for the wall between the two annuli of the refiner accommodates expansions and contractions of the gallium.

The double annulus refiner consists of an inner rigid tube, the outside wall of which is covered, if necessary, with a layer of heat shrinkable tubing, a second tube of flexible tubing spaced from the rigid tube to form a first annulus, a third tube made of a suitable material and spaced from the second tube to form a second annulus, and two end plates that substantially close the ends of the first, second and third tubes and are provided with means for communication with the inner tube and the first annulus. At least one reciprocating radio frequency induction coil surrounds the outer, third tube in close proximity thereto and reciprocates along the height of the refiner. The second, outer annulus has an inlet and an outlet for a cooling fluid.

The gallium is zone refined by enclosing a charge of impure gallium in the first annulus of the stationary refiner. An annularly-shaped seed crystal of gallium is formed at the head, i.e. bottom, of the gallium to be refined. A cooling liquid at a predetermined constant temperature is passed through the second annulus of the refiner. The cooling liquid is chosen such that cooling temperatures from $-100°$ to $+30°$ C. can be used. At least one molten zone is created in the gallium ingot by radio frequency heating and the zone is moved through the gallium by applying radio frequency waves to the ingot from the at least one reciprocating radio frequency induction coil. After making the required number of passes to complete the zone refining of the gallium charge to the desired degree of purity, the radio frequency field is shut down, the gallium charge is cropped in situ, and the refined gallium is melted and removed from the first annulus of the refiner. Cropping of the gallium is readily accomplished by separately melting the required amounts of gallium at the head and the tail ends of the ingot and removing the molten portions from the refiner.

The simple apparatus makes it possible to produce gallium with a 79 to 89 purity in large quantities as the refiner can be easily scaled up to treat charges as large as 50 kg or more.

It is an object of the present invention to provide a process for the zone refining of gallium. This and other objects of the present invention will become clear from the detailed description.

Accordingly, there is provided a method for the zone refining of gallium that comprises enclosing a charge of impure gallium having a head portion and a tail portion in a first annulus of a stationary, vertical, double annulus refiner, said first annulus being defined by an inner wall and an outer wall made of a material that does not impart impurities to the charge of gallium, said outer wall being made of a flexible material; applying a flow of a suitable cooling fluid at a predetermined constant temperature to a second annulus of said refiner to effect cooling, said second annulus enveloping said first annulus; positioning at least one annular radio frequency induction heating coil around said second annulus an narrowly spaced therefrom, said coil being reciprocally movable along the height of said refiner; applying radio frequency waves from said coil to said charge of gallium to effect heating and to form at least one zone of molten gallium in said charge; moving said molten zone through the charge of gallium in one direction by reciprocatedly moving said coil for a required number of passes whereby impurities in the impure gallium segregate and collect in the tail portion, the head portion or both of said charge; and recovering zone refined gallium from said first annulus. Preferably, the refiner is made of Teflon TM.

BRIEF DESCRIPTION OF THE DRAWINGS

The invention will now be described in detail with reference to the accompanying drawings wherein.

DETAILED DESCRIPTION OF THE PREFERRED EMBODIMENTS

Figure 1:
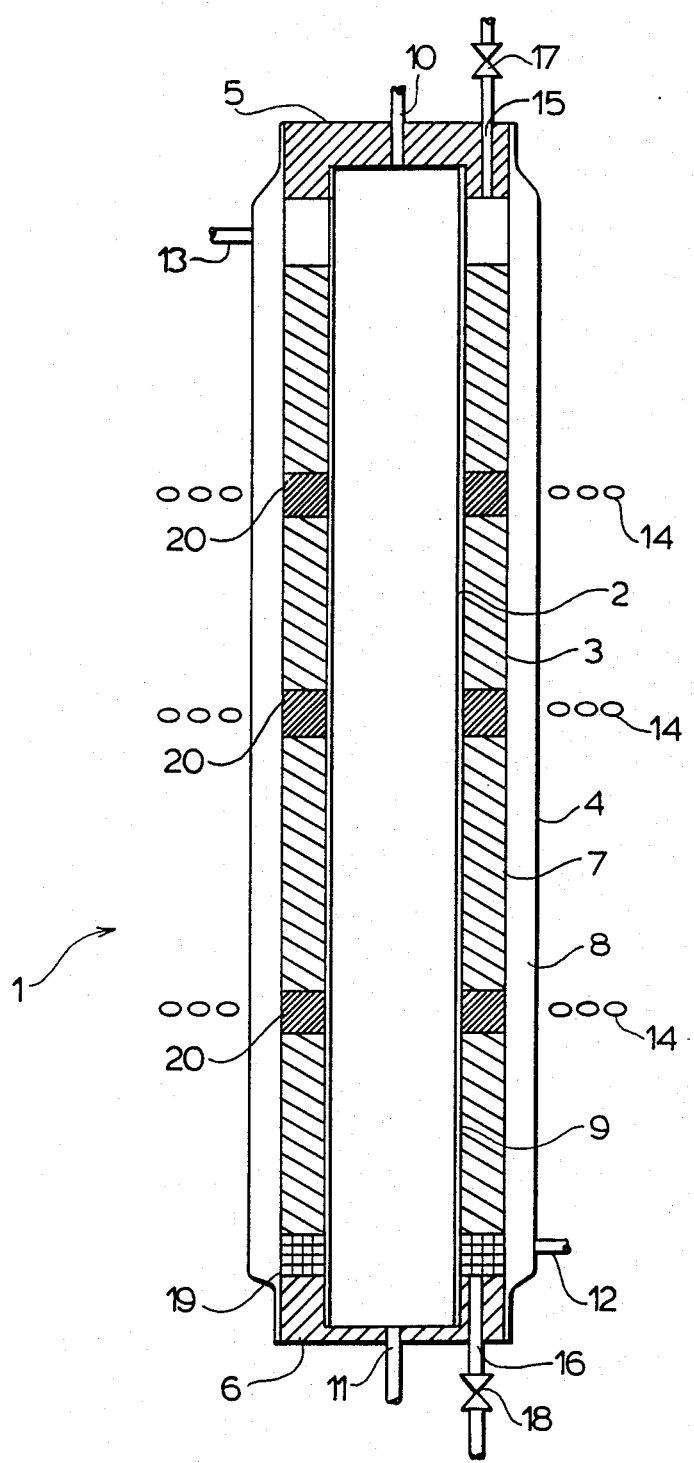
FIG. 1 illustrates a schematic cross-section of the apparatus of the invention.

With reference to FIG. 1, the zone refining of gallium is carried out in a stationary, vertical, double annulus zone refiner generally indicated at 1. The refiner 1 consists of an inner tube 2, adapted for circulation of cooling fluid therethrough, a concentric intermediate tube 3, a concentric outer tube 4, an upper end plate 5 and a lower end plate 6. The end plates 5 and 6 substantially close the upper and lower ends, respectively, of tubes 2, 3 and 4. A first annulus 7 for containment of a charge of gallium is defined between inner tube 2 and intermediate tube 3. A second annulus 8 adapted for circulation of a cooling fluid is defined between intermediate tube 3 and outer tube 4.

The inner tube 2 is made of a suitable rigid material that has low thermal and electrical conductivities and low impurity diffusion coefficients at 30° C., and may conveniently have a high optical transmission factor. Suitable materials are quartz, rigid polyvinylchloride, or rigid Teflon TM. In the case of materials such as quartz and polyvinyl chloride, tube 2 is covered with a sleeve 9 of Teflon TM FEP 1.3X heat-shrinkable tubing. As tube 2 contacts gallium in the first annulus 7, the material that contacts gallium, i.e. the outer surface of tube 2, must be non-wetting and of the highest possible purity so that substantially no impurities transfer to the gallium during zone refining. Teflon TM FEP 1.3X heat-shrinkable tubing satisfies these requirements. When inner tube 2 is made of rigid Teflon TM, sleeve 9 is not needed.

The intermediate tube 3, concentric to inner tube 2 to form first annulus 7, also contacts gallium and is, therefore, made of a suitable material that satisfies the same requirements as those for the surface of inner tube 2. To accommodate the volume expansions and contractions of gallium upon phase changes, intermediate tube 3 must be flexible and also have adequate strength, thickness and thermal conductivity. The above mentioned Teflon TM FEP 1.3X heat-shrinkable tubing has the desired suitable characteristics. It is, of course, understood that other materials with similar characteristics may be used. The flexibility of intermediate tube 3 and the hydrostatic pressure exerted by the cooling fluid in second annulus 8 on tube 3 improve thermal contact between gallium and cooling fluid.

The outer tube 4, concentric to intermediate tube 3 to form the second annulus 8, may be made of a rigid or a flexible material that is electrically non-conductive, has easy fabrication properties and is, preferably, transparent. Transparency, i.e. high optical transmission factors, for the tubes 2, 3 and 4 is desirable to allow visual observation of the refining process and the cropping after zone refining of a charge. Although quartz, glass, polymethylmethacrylate and the like may be used, the above mentioned Teflon TM FEP 1.3X heat-shrinkable tubing satisfies the requirements. Outer tube 4 has an inlet 12 at its lower end, preferably in a tangential direction, and an outlet 13 at its upper end for admitting cooling fluid to and discharging cooling fluid from the second annulus 8. Means (not shown) are provided to recirculate cooling fluid at a predetermined constant temperature to inlet 12 from outlet 13. The end plates 5 and 6 are preferably made of rigid Teflon TM. Upper end plate 5 is provided with passages 10 and 15 to provide communication with inner tube 2 and first annulus 7, respectively. Lower end plate 6 is, similarly, provided with passages 11 and 16 for communication with inner tube 2 and first annulus 7, respectively. Passages 10, 11, 15 and 16 are adapted to receive standard Teflon TM fittings. Passages 10 and 11 are connected to the means (not shown) for the recirculation of a fluid. The fittings in passages 15 and 16 include opening and closing means 17 and 18, respectively.

At least one annular, reciprocating, radio frequency (RF) induction coil 14 is positioned concentrically around outer tube 4 of the refiner and in close proximity thereto. Coil is adapted to reciprocate, by means not shown, substantially along the height of the refiner between end plates 5 and 6. When two or more coils are used, the coils are coupled and act in tandem substantially between end plates 5 and 6. Induction coils are operatively connected to and energized by an RF wave generator (not shown). When two or more coils are used, the coils are appropriately vertically spaced from each other at a distance sufficient to ensure that solid zones of gallium exist between the molten zones during zone refining.

In the assembly of zone refiner 1, a sleeve of heat-shrinkable Teflon TM FEP 1.3X is placed around inner tube 2 and is heat-shrunk to provide a substantially tightly-fitting sleeve 9. (As mentioned, when inner tube 2 is made of a rigid Teflon, no sleeve 9 is required). Subsequently the end plates 5 and 6 are positioned at the ends of inner tube 2, and a tube of heat-shrinkable Teflon TM FEP 1.3X is placed around the assembly and subjected to heat to form flexible intermediate tube 3 defining first annulus 7. The diameter of the heat shrinkable tube is chosen such that, after shrinking, tube 3 has the desired diameter and fits tightly over the outside of the two end plates. A length of Teflon TM FEP 1.3X heat-shrinkable tubing is then placed around intermediate tube 3 and heat-shrunk at its upper and lower extremities only around end plates 5 and 6 to form outer tube 4 spaced from intermediate tube 3 and forming second annulus 8 extending substantially between upper end plate 5 and lower end plate 6. Outer tube 4 is further secured by tightening clamping means such as hose clamps (not shown) around the upper and lower end plates 5 and 6. Fittings are attached to inlet 12 and outlet 13 of outer tube 4 at its lower and upper end, respectively, the fitting attached to inlet 12, preferably, being tangentially directed to cause cooling fluid to enter second annulus 8 tangentially. In case a rigid material for outer tube 4 is used, the outer tube is adapted, such as, for example, with annular spacers (not shown) for spacing outer tube 4 from intermediate tube 3, and secured to end plates 5 and 6.

According to the method of the invention, a charge of gallium is zone refined in the first annulus 7 of refiner 1. To insure crystallization of the first zone, an annular seed crystal 19 is formed at the bottom of the refiner prior to zone refining of the charge of gallium. The seed crystal may be formed of impure or high-purity, i.e. unrefined or refined, gallium. The critical requirements for the seed crystal are exposure of the full annular surface area of the first annulus to the charge of gallium to be zone refined and maintaining the seed crystal in solid form at all times during zone refining. The latter is easily achieved by limiting the travel of coil 14 during refining to somewhat above the top of lower end plate 6. The seed crystal 19 is positioned in first annulus 7 by liquefying an amount of gallium at least sufficient to cover the bottom of annulus 7 and to expose the full annular surface of gallium to be refined, and adding the liquefied gallium for the seed crystal to annulus 7 through passage 16 in lower end plate 6 or, alternatively, through passage 15 in upper end plate 5. The liquefied gallium is solidified by means of cooling fluid circulating through second annulus 8. When the solid seed crystal is in place, a charge of gallium is added in portions to first annulus 7 through passage 15 in upper end plate 5, each portion being solidified prior to adding the next, to form a gallium ingot. The addition in portions prevents bulging of the flexible intermediate tube 3 due to hydrostatic pressure exerted by the liquid gallium. Because of the flow pattern of the cooling fluid and the requirement of constant cooling over the length of the gallium ingot, the size of the gallium ingot is such that annulus 7 is filled to about 90% of its height.

Cooling fluid is passed through the second annulus 8 and, if desired, may additionally be passed through inner tube 2. The cooling fluid enters second annulus 8 through inlet 12 and enters inner tube 2 through inlet 11, and leaves annulus 8 and inner tube 2 through outlets 13 and 10, respectively. It is desired that inlets 12 and 11 feed cooling fluid into annulus 8 and inner tube 2 in a tangential direction. Tangential feeding ensures that the flow of cooling fluid up the refiner is uniform which results in the molten zones in the gallium to be uniformly shaped and of substantially even thickness. Usually, cooling fluid is only passed through second annulus 8.

Cooling fluids are chosen such that temperatures in the range of as low as minus 100° C. and as high as the melting point of gallium can be used. This wide range may be necessary because gallium can severely supercool. Suitable liquids are selected from the group consisting of water, glycol, suitable alcohols, glycol-water mixtures and suitable alcohol-water mixtures. The cooling liquid is recirculated through the refiner and is maintained at a substantially constant predetermined temperature that is dependent on the zoning rate and the RF power. A preferred cooling liquid is water maintained at a constant temperature of about 8° C. RF waves, generated by an RF wave generator, are emitted from the induction coil 14 or coils (three are shown) to cause the formation of at least one molten zone 20 (three are shown) in the gallium ingot in annulus 7. Depending on the power rating of the generator, RF power is applied to the coil(s) at a level sufficient to create a height (thickness) of a molten zone 20 equal to about 5% of the height of the ingot. A wide range of frequencies may be used, but the RF waves must be able to penetrate through the cooling liquid into the gallium ingot.

So that heat can be transferred efficiently in the ingot of gallium by RF heating, the volume of gallium being zone refined must be limited. The use of an annular ingot of gallium makes it possible, however, to refine a large quantity. The use of an annular ingot gives a relatively high ratio of surface to volume which allows more efficient heating and cooling of the gallium. By applying the heating and cooling to the same surface of the ingot, the thermal gradients at the solid-liquid interfaces of each of the molten zones are improved, which in turn improve the stability of the interfaces, i.e. no melt-back occurs, and thus gives uniform zone characteristics. The quantity of gallium being zone refined can be easily increased by increasing the size of the annulus, i.e., increasing the inner and outer diameter of the first annulus while maintaining substantially the same width of the annulus.

The applied power, the temperature of the cooling fluid and the rate of zone refining are interrelated. For example, for a given power input, a higher zoning rate can be used when the cooling fluid temperature is lowered. The coil 14, or coils connected in tandem, is reciprocated along the height of the gallium ingot in the first annulus 7. The speed of the coil or coils in the upward direction is at the zoning rate to move one or more molten zones, each having adjacent solid zones, through the melt. After the uppermost molten zone has reached the top of the gallium in the refiner, the coil or coils are relatively rapidly returned to the starting position to start a subsequent pass of zone refining. The reciprocating is repeated until the desired number of passes is made. The number of passes depends on the desired purity of the refined gallium. Zone refining in an upward direction is preferred as it assists in the floating of any oxide to the top end of the refiner. The refined gallium is subsequently recovered.

During zone refining, the impurities in the gallium with distribution coefficients of less than one are moved to the upper end, i.e. tail, of the ingot, while those with coefficients of greater than one are moved to the lower end, i.e. head, of the ingot. When the zone refining is completed, the ingot is cropped as desired by removing either or both the tail portion and the head portion from the ingot, the former including any oxide and the latter including the seed crystal.

To effect cropping, an induction coil is positioned and energized at the lower end of the ingot to melt that portion that is to be cropped, while the remainder of the ingot is maintained in the solid state. The molten, cropped head portion is then simply drained from the refiner through passage 16. An induction coil is subsequently positioned at the upper portion of the ingot to melt the desired portion of the tail of the ingot. The molten, cropped tail portion is simply removed by syphoning it from the refiner through opening 15 in the upper end plate 5. Either one or both of the cropped portions may amount to as little as a few to as much as 25% of the ingot, depending on the desired purity of the refined gallium. After cropping the ingot, the remaining portion of the refined gallium is removed from the refiner by melting the gallium either by applying RF heating or by flowing hot water through the inner tube 2 and draining the molten gallium from the bottom of the refiner through opening 16. Alternatively, the head portion is removed first, then the refined gallium and then the remaining tail portion. If desired, the refined gallium, after cropping, may be subjected to further zone refining after which the further refined gallium is cropped and subsequently recovered.

The invention will now be illustrated by means of the following non-limitative example.

EXAMPLE

The double annulus zone refiner, as described above, positioned vertically, with a length of 1100 mm between end plates, had a quartz inner tube with a diameter of 116 mm covered with a 0.5 mm thick layer of heat-shrunk Teflon TM FEP 1.3X. The concentrically located intermediate tube made of the same Teflon TM FEP 1.3X had an outside diameter of 164 mm and a thickness of 0.5 mm forming a 23 mm wide first annulus. The concentrically located outer tube was made of heat-shrunk Teflon TM FEP 1.3X spaced from the intermediate tube to form the 6.5 mm wide second annulus (178 mm outside diameter). A 20 mm thick annular seed crystal of 69 purity gallium was formed in the bottom of the first annulus. Three RF induction coils were spaced 229 mm apart with a 19 mm space from the outside of the refiner. 43 kg of impure molten gallium was added in sequential portions to the first annulus, each portion being frozen prior to addition of the next by flowing cooling fluid through the second annulus. The impure gallium had an impurity concentration of 120 ppb (parts per billion) as determined by glow discharge mass spectrometry (GDMS). Water was passed through the second annulus at a rate of 2 l/min at a temperature maintained constant at 8° C. RF power was applied to give molten zones between 20 and 50 mm wide. The gallium ingot was zone refined at a rate of 7.3 mm/h, and 18 passes were made. The refined gallium was removed from the refiner by RF heating in five separately melted sections, each representing a fraction of the ingot. Each fraction was then analyzed by GDMS. The analyses results are listed in Table I sequentially from the head of the ingot (section 1) to the last to freeze, i.e. tail, of the ingot (section 5).

TABLE I

| Section | Fraction in % | Impurity Concentration in ppb | | | | | | | Total |
|---|---|---|---|---|---|---|---|---|---|
| | | Si | S | Fe | Ni | Cu | In | Sn | Pb | |
| 1 | 15 | ND | ND | 1 | 2 | 2 | ND | ND | ND | 5 |
| 2 | 31 | ND | ND | 3 | 2 | 6 | ND | ND | 2 | 13 |
| 3 | 15 | 3 | ND | 2 | 2 | 18 | 2 | ND | 13 | 40 |
| 4 | 15 | ND | ND | 22 | 4 | 40 | 0.6 | ND | 4 | 50.6 |
| 5 | 24 | 2 | 14 | 7 | 6 | 78 | 12 | 15 | 40 | 174 |

Section 5 was "discarded". The remaining fractions represent gallium with a purity in the 79 to 89 range. This refined gallium was used to produce single crystal gallium arsenide using a high-pressure liquid-encapsulated Czochralski (LEC) technique. Two 4.5 kg, 76 mm diameter crystals A and B were produced from the zone refined gallium. The resistivity and mobility of the seed, middle and tail ends of the crystals were measured. The results are listed in Table II.

TABLE II

| Crystal | Sample position | Resistivity in Ohm cm | Mobility in $cm^2 v^{-1} s^{-1}$ |
|---|---|---|---|
| A | seed | $1.4 \times 10^7$ | 6900 |
| | middle | $1.5 \times 10^7$ | 7400 |
| | tail | $1.1 \times 10^7$ | 6900 |
| B | seed | $2.6 \times 10^7$ | 7300 |
| | middle | $2.5 \times 10^7$ | 7200 |
| | tail | $2.2 \times 10^7$ | 7000 |

Figure 2:
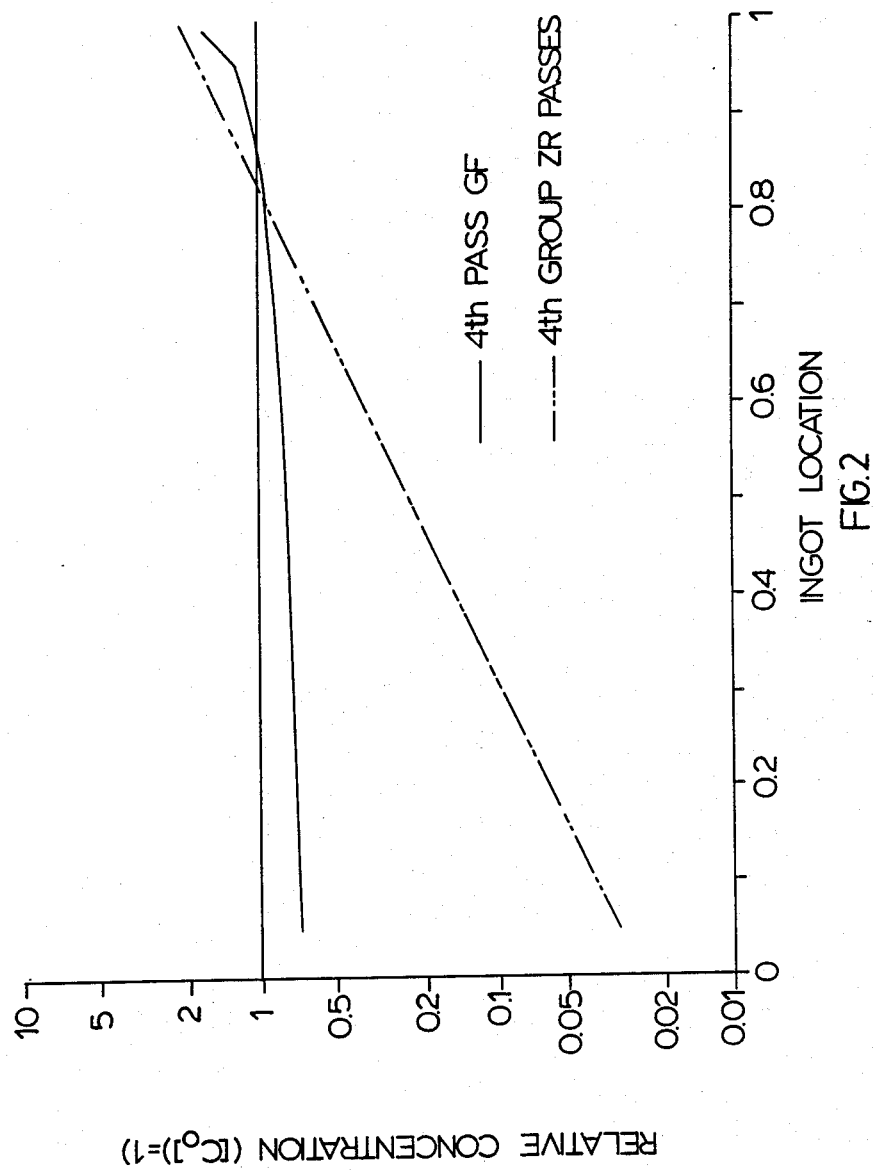
FIG. 2 shows comparative graphs for an impurity concentration in zone refined and gradient freeze refined gallium.

The results in Table II show that crystals A and B zone refined according to the invention had uniform resistivity and mobility characteristics throughout the crystals. Gallium, similarly zone refined to ultimate distribution with 10% tail end cropping, four times, was then compared with four-pass gradient freeze purified gallium by plotting the relative concentrations of an impurity against location in the ingot. Using copper as an example of an impurity, the distribution coefficient was determined from GDMS analyses to be 0.79. The plots are shown in FIG. 2. It can be seen that gradient freeze purification has a relatively constant distribution of the impurity up to the last 15% of the ingot. In distinction, the impurity concentration in zone refined gallium increases linearly from a much lower initial value to values similar to those for gradient freeze refining for the last 15% of the ingot. Thus, when 15% of both the ingots is cropped, the remaining portion of the zone refined ingot has a much higher average purity than the ingot purified by the gradient freeze method.

It is understood that changes and modifications may be made in the embodiments of the invention without departing from the scope of the appended claims.

We claim:

1. A method for the zone refining of gallium comprising enclosing a charge of impure gallium having a head portion and a tail portion if a first annulus of a stationary, vertical, double annulus refiner, said first annulus being defined by an inner cylindrical wall and an outer cylindrical wall made of a material that does not impart impurities to the charge of gallium, said outer cylindrical wall being made of a flexible material; applying a flow of a suitable cooking fluid at a predetermined constant temperature to a second annulus of said refiner to effect cooling, said second annulus being defined by an exterior cylindrical wall enveloping said first annulus; positioning at least one annular radio frequency induction heating coil around said second annulus and narrowly spaced therefrom, said coil being reciprocally movable along the height of said refiner; applying radio frequency waves form said coil to said charge of gallium to effect heating and to form at least one zone of molten gallium in said charge; moving said molten zone through the charge of gallium in one direction by reciprocately moving said coil for a required number of passes whereby impurities in the impure gallium segregate and collect in the tail portion, the heats position or both of said charge; and recovering zone refined gallium form said first annulus.

2. A method as claimed in claim 1, wherein said cooling fluid is chosen such that temperatures in the range of from about minus 100° C. to the melting point of gallium can be used, and is selected from the group consisting of water, glycol, suitable alcohols, mixtures of glycol and water, and mixtures of suitable alcohol and water.

3. A method as claimed in claim 2, wherein said cooling fluid is water maintained at a temperature of about 8° C.

4. A method as claimed in claim 1, wherein said cooling fluid enters said refiner in a tangential direction at the base thereof causing a uniform flow of cooling fluid up the refiner.

5. A method as claimed in claim 4, wherein, additionally, cooling fluid is applied to the inside of said inner wall of the first annulus.

6. A method as claimed in claim 1, wherein an annular seed crystal of gallium is present in the solid state during the zone refining of said charge of impure gallium and said crystal exposes the full annular surface area of said first annulus to said charge.

7. A method as claimed in claim 1, wherein radio frequency power is applied to said coil sufficient to create a molten zone in said charge with a height equal to about 5% of the height of said charge.

8. A method as claimed in claim 1, wherein at least two coils are used and said coils are vertically spaced from each other at a distance sufficient to ensure that solid zones of gallium exist between the molten zones during zone refining.

9. A method as claimed in claim 1, wherein said head portion and said tail portion are separately cropped prior to removing said zone refined gallium from said first annulus.

10. A method as claimed in claim 9, wherein said head portion is removed from the refiner by melting the required portion of the charge by applying radio frequency waves to melt said head portion and draining the molten head portion from the refiner.

11. A method as claimed in claim 9, wherein said tail portion is removed from the refiner by melting the required portion of the charge by applying radio frequency waves to melt said tail portion and syphoning the molten tail portion from the refiner.

12. A method as claimed in claim 1, wherein said refiner is made of polytetrafluoroethylene.

13. A method as claimed in claim 1, wherein said outer wall of the first annulus is made of flexible polytetrafluoroethylene FEP 1.3X heat-shrinkable tubing.

14. A method as claimed in claim 1, wherein the surfaces contacting gallium of said first annulus are of polytetrafluoroethylene FEP 1.3X heat-shrinkable tubing.

15. A method as claimed in claim 1, wherein said inner wall of said first annulus is made of a rigid material and is covered with a sleeve of polytetrafluoroethylene FEP 1.3X heat-shrinkable tubing.

16. A method as claimed in claim 1, wherein said heating and cooling are applied to the same surface of said charge of gallium whereby the thermal gradients at the solid-liquid interfaces of each of the molten zones are improved for uniform zone characteristics.

17. A method for the zone refining of gallium comprising enclosing a charge of impure gallium having a head portion and a tail portion in a first annulus of a stationary, vertical, double annulus refiner, said first annulus being defined by an inner cylindrical wall and an outer cylindrical wall made of a material that does not impart impurities to the charge of gallium, said outer cylindrical wall being made of a flexible material; applying a flow of water at a temperature of about 8° C. to a second annulus of said refiner in a tangential direction at the base thereof to effect uniform cooling, said second annulus being defined by an exterior cylindrical wall enveloping said fist annulus; maintaining a seed crystal of gallium in the solid state during the zone refining, said crystal exposing the full annular surface area of said first annulus to said charge; positioning at least one annular radio frequency induction heating coil around said second annulus and narrowly spaced therefrom, said coil being reciprocally movable along the height of said refiner; applying radio frequency waves from said coil to said charge of gallium to effect heating and to form at least one zone of molten gallium in said charge; the power of said radio frequency waves being sufficient such that said zone of molten gallium has a height of about 5% of the height of said charge; moving said molten zone through the charge of gallium in one direction by reciprocately moving said coil for a required number of passes whereby impurities in the impure gallium segregate and collect in the tail portion, the head portion or both of said charge; separately cropping said tail portion and said head portion; and recovering zone refined gallium from said first annulus.

18. A method as claimed in claim 17, wherein said refiner is made of polytetrafluoroethylene.

19. A method as claimed is claim 18, wherein the walls of said first annulus and said second annulus are made of polytetrafluoroethylene 1.3x heat-shrinkable tubing.

* * * * *